(12) United States Patent
Takahashi (10) Patent No.: US 10,714,851 B2
(45) Date of Patent: Jul. 14, 2020

(54) INTERFACE STRUCTURE (71) Applicant: Sensata Technologies, Inc., Attleboro, MA (US)

(72) Inventor: Hideyuki Takahashi, Shizuoka (JP)

(73) Assignee: Sensata Technologies, Attleboro, MA (US)

( * ) Notice: Subject to any disclaimer, the term of this patent is extended or adjusted under 35 U.S.C. 154(b) by 189 days.

(21) Appl. No.: 15/376,286

(22) Filed: Dec. 12, 2016

(65) Prior Publication Data

US 2017/0171985 A1 Jun. 15, 2017

(30) Foreign Application Priority Data

Dec. 14, 2015 (JP) .................................. 2015-242793

(51) Int. Cl.
H01R 12/70 (2011.01)
H01R 24/58 (2011.01)
(Continued)

(52) U.S. Cl.
CPC ....... *H01R 12/7076* (2013.01); *G01R 1/0466* (2013.01); *H01R 12/716* (2013.01); *H01R 13/111* (2013.01); *H01R 13/2421* (2013.01); *H01R 13/631* (2013.01); *H01R 24/58* (2013.01); *H01R 43/20* (2013.01); *H01R 43/205* (2013.01);
(Continued)

(58) Field of Classification Search
CPC .. H01R 43/20; H01R 43/205; H01R 12/7076; H01R 12/714; H01R 12/716; H01R 13/111; H01R 13/2421; H01R 13/631; H01R 24/58; H01R 12/57; H01R 13/035; H01R 13/187; H05K 3/32; H05K 7/10; G01R 1/0466; G01R 3/00; G01R 1/0458;
(Continued)

(56) References Cited

U.S. PATENT DOCUMENTS 4,080,027 A 3/1978 Benasutti
5,308,249 A 5/1994 Renn et al.
(Continued)

FOREIGN PATENT DOCUMENTS

JP 2001093634 A 4/2001
JP 2002014113 A 1/2002
(Continued)

OTHER PUBLICATIONS

Machine Translation of Japanese Patent Publication JP 2011-258547, Dec. 2019. (Year: 2011).*

(Continued)

*Primary Examiner* — A. Dexter Tugbang (74) *Attorney, Agent, or Firm* — Burns & Levinson, LLP; George Chaclas; Paul D. Sorkin (57) ABSTRACT

An interface structure connecting an electronic component to a circuit board. The interface structure includes a base defining an elongated through hole with a central axis and a coil spring retained in the elongated through hole. The coil spring has a proximal portion and a distal portion extending from the elongated through hole in an uncompressed condition and being offset at an angle with respect to the central axis. As the coil spring is compressed, the coil spring creates a force having a component substantially perpendicular to the central axis.

12 Claims, 12 Drawing Sheets

(51) Int. Cl.
   *H01R 43/20* (2006.01)
   *H01R 13/24* (2006.01)
   *G01R 1/04* (2006.01)
   *H01R 12/71* (2011.01)
   *H01R 13/11* (2006.01)
   *H01R 13/631* (2006.01)
   *H05K 3/32* (2006.01)
   *H05K 7/10* (2006.01)
   *G01R 3/00* (2006.01)

(52) U.S. Cl.
   CPC .............. *H05K 3/32* (2013.01); *H05K 7/10* (2013.01); *G01R 1/0458* (2013.01); *G01R 3/00* (2013.01); *H01R 12/714* (2013.01); *Y10T 29/49151* (2015.01); *Y10T 29/49208* (2015.01); *Y10T 29/49218* (2015.01)

(58) Field of Classification Search
   CPC ......... Y10T 29/49151; Y10T 29/49208; Y10T 29/49218
   See application file for complete search history.

(56) References Cited

U.S. PATENT DOCUMENTS

| | | | |
|---|---|---|---|
| 5,388,997 A | 2/1995 | Grange et al. | |
| 5,388,998 A | 2/1995 | Grange et al. | |
| 5,427,553 A | 6/1995 | Tsuji | |
| 5,443,394 A | 8/1995 | Billman et al. | |
| 5,676,559 A | 10/1997 | Laub et al. | |
| 5,800,186 A | 9/1998 | Ramirez et al. | |
| 6,050,862 A | 4/2000 | Ishii | |
| 6,313,523 B1 | 11/2001 | Morris et al. | |
| 6,337,572 B1* | 1/2002 | Kazama | G01R 3/00 324/755.05 |
| 6,341,962 B1 | 1/2002 | Sinclair | |
| 6,666,691 B2 | 12/2003 | Ikeya | |
| 6,776,668 B1 | 8/2004 | Scyoc et al. | |
| 6,790,065 B2 | 9/2004 | Fukunaga | |
| 6,848,928 B2 | 2/2005 | Ikeya et al. | |
| 7,288,005 B2 | 10/2007 | Nagahashi | |
| 7,513,806 B2 | 4/2009 | Noda et al. | |
| 7,626,408 B1 | 12/2009 | Kaashoek | |
| 7,651,366 B2 | 1/2010 | Ringler et al. | |
| 7,666,000 B1 | 2/2010 | Hsiao et al. | |
| 7,666,016 B2 | 2/2010 | Kobayashi | |
| 7,695,285 B2 | 4/2010 | Sugiura et al. | |
| 7,887,355 B2 | 2/2011 | Watanabe | |
| 7,946,855 B2 | 5/2011 | Osato | |
| 7,976,326 B2 | 7/2011 | Stoner | |
| 8,263,879 B2 | 9/2012 | Hougham et al. | |
| 8,373,430 B1 | 2/2013 | Sochor | |
| 8,385,080 B2 | 2/2013 | Kim et al. | |
| 8,388,365 B2 | 3/2013 | Takahashi et al. | |
| 8,535,079 B2 | 9/2013 | Wang et al. | |
| 8,545,240 B2 | 10/2013 | Casher et al. | |
| 8,556,638 B2 | 10/2013 | Tsubaki et al. | |
| 8,734,190 B2 | 5/2014 | Schlitzkus et al. | |
| 8,758,067 B2 | 6/2014 | Rathburn | |
| 8,764,464 B2 | 7/2014 | Buck et al. | |
| 8,919,656 B2 | 12/2014 | Eckerdt | |
| 9,748,678 B2 | 8/2017 | Petrarca et al. | |
| 2002/0160637 A1* | 10/2002 | Ishizuka | H01R 13/2421 439/131 |
| 2003/0109163 A1 | 6/2003 | Shimada | |
| 2003/0236018 A1* | 12/2003 | Mimoto | H01R 24/58 439/357 |
| 2004/0077225 A1* | 4/2004 | Chun-Fu | H01R 13/2471 439/700 |
| 2004/0132320 A1* | 7/2004 | Dittmann | H01R 13/2421 439/66 |
| 2005/0233614 A1 | 10/2005 | Gattuso et al. | |
| 2006/0267620 A1 | 11/2006 | Ang | |
| 2009/0017703 A1 | 1/2009 | Takahashi et al. | |
| 2011/0117796 A1* | 5/2011 | Oishi | H01R 13/2421 439/841 |
| 2011/0171841 A1 | 7/2011 | Tsubaki et al. | |
| 2011/0201221 A1 | 8/2011 | Kobayashi | |
| 2011/0290539 A1 | 12/2011 | Willner et al. | |
| 2013/0330983 A1* | 12/2013 | DiFonzo | H01R 13/2421 439/819 |
| 2015/0072543 A1 | 3/2015 | Willner et al. | |
| 2015/0126077 A1* | 5/2015 | van Ekstrom | H01R 13/2421 439/700 |

FOREIGN PATENT DOCUMENTS

| | | | |
|---|---|---|---|
| JP | 2002170617 A | | 6/2002 |
| JP | 2003100375 A | | 4/2003 |
| JP | 2004031260 A | * | 1/2004 |
| JP | 2010153321 A | | 7/2010 |
| JP | 2011/258547 A | | 12/2011 |
| JP | 4854612 B2 | | 1/2012 |
| WO | 2004/075354 A1 | | 9/2004 |
| WO | 2010/027597 A2 | | 3/2010 |
| WO | WO-2014042264 A1 | | 3/2014 |

OTHER PUBLICATIONS

European Search Report for European Patent Application No. 16275168.9 dated Apr. 19, 2017, 8 pages.
Examination report for European patent application No. 16275168.9, dated Apr. 15, 2019, 8 pages.

\* cited by examiner

FIG. 1

(PRIOR ART)

(PRIOR ART)

INTERFACE STRUCTURE

CROSS-REFERENCE TO RELATED APPLICATION

This application claims the benefit of Japanese Patent Application No. 2015-242793 filed Dec. 14, 2015, which is incorporated herein by reference.

BACKGROUND OF THE INVENTION

The present disclosure relates to an interface structure using spring contacts, particularly to the interface structure for detachably connecting an electronic component such as an IC socket to a board.

IC sockets have been widely used as an interface for electrically connecting a semiconductor device to a print board. An IC socket loading a surface-mount type semiconductor device such as BGA (Ball Grid Array), CSP (Chip Sized Package) or LGA (Land Grid Array) includes a base member on which the bottom surface of the semiconductor device is loaded, and a cover member that presses the loaded semiconductor device to the base member so as to allow solder balls at the bottom of the semiconductor device to contact with probe pins [See, for example, Japanese Patent publication no. 2001-093634A.

Figure 1:
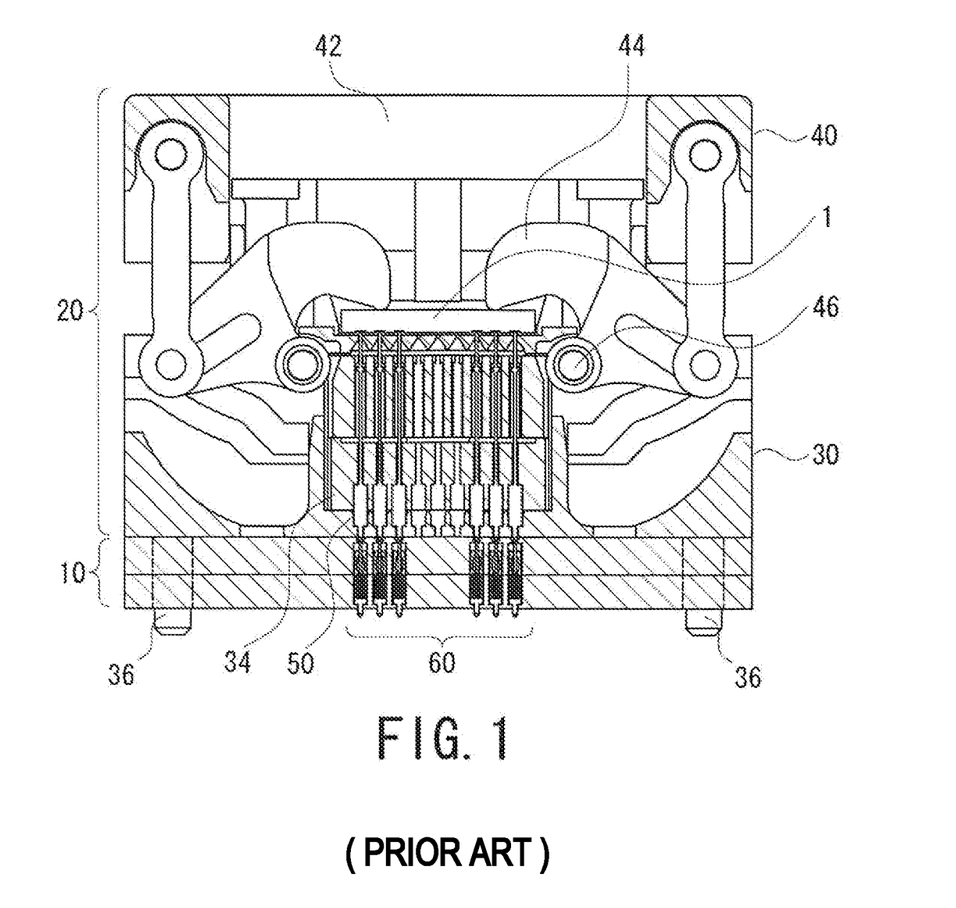
FIG. 1 is a cross sectional view of a conventional socket.
Figure 2A:
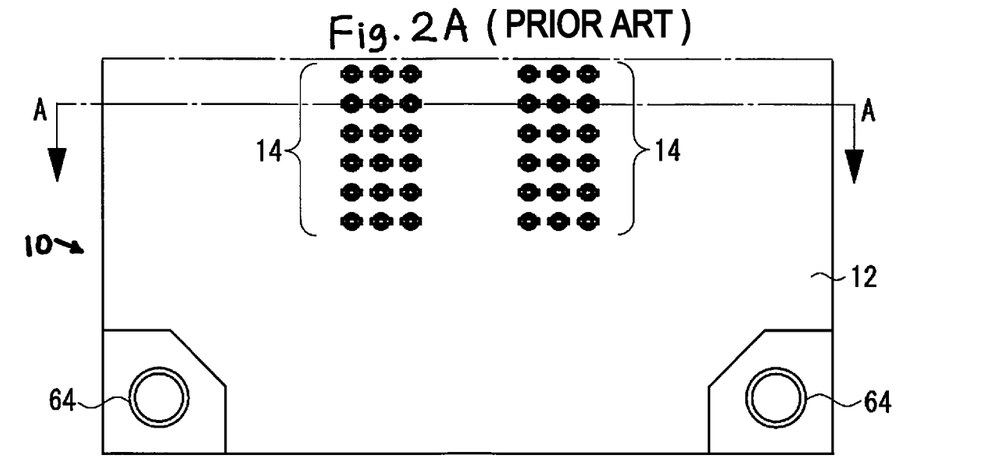
FIG. 2A is a general plane view of the conventional socket.
Figure 2B:
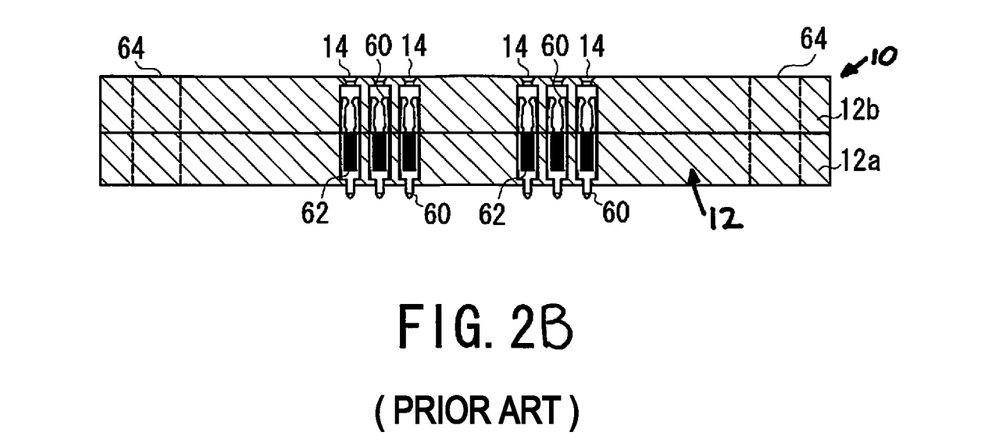
FIG. 2B is a cross sectional view taken along line A-A in FIG. 2A.

The IC socket is also mounted on a circuit board for measuring electrical characteristics or reliability of the loaded semiconductor device. In such mounting, since the terminals of the socket and the circuit board are directly connected each other by the solder, the socket cannot be easily removed from the board. Correspondingly, Japanese Patent No. 4854612B provides an adapter for socket for allowing the socket to be removed from the board. FIGS. 1, 2A and 2B are from Japanese Patent No. 4854612B and show an adaptor 10 for a socket 20. The adaptor 10 is connected in between a circuit board and the socket 20 to provide the electrical interface to both. The socket 20 enables to load different packages 1 such as BGA, LGA and LGA. The socket 20 includes, for example, a base member 30, a cover member 40 that reciprocates in directions approaching to or separating away from the base member 30, and a plurality of contacts 50 planted in the base member 30 respectively. The package 1 is loaded onto a mounting member through an opening 42 of the cover member 40. A pair of latch members 44 can be moved in response to the reciprocated movement of the cover member 40 and is rotated on a pin or rotation axis 46 to press the top surface of the package 1. The contacts 50 are supported by a contact support portion 34. The upper ends of the contacts 50 are contacted with the terminals at the bottom of the package 1 respectively. The lower ends of the contacts 50 are protruded from the base member 30 and are inserted into through holes of the adapter 10 respectively. Cylindrical post portions 36 used for positioning are formed at each corner portion of the bottom of the base member 30.

The adaptor 10 includes a main adaptor 12 which includes a lower adaptor 12a and an upper adaptor 12b. A plurality of through holes 14 are formed in the lower adaptor 12a and the upper adaptor 12b respectively, whose positions correspond to each contact 50. Additional through holes 64 for positioning are also formed in each corner portion of the main adaptor 12 to insert the post portion 36 of the socket 20. A probe pin 60 and a coil spring 62 for urging the probe pin 60 are accommodated in the through hole 14, and the probe pin 60 holds the contact inserted from the through hole 14.

Figure 3:
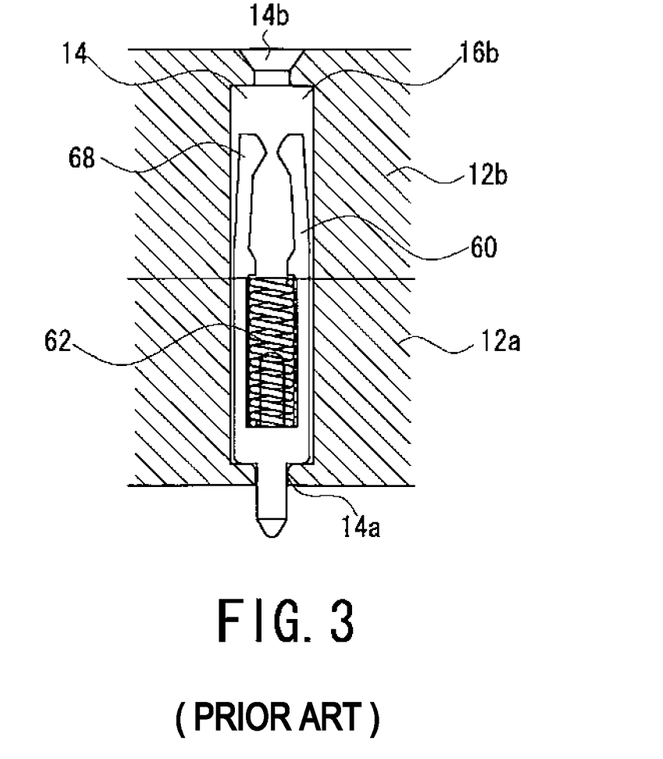
FIG. 3 is an enlarged sectional view of the conventional adaptor for socket.

FIG. 3 is also from Japanese Patent No. 4854612B and shows an enlarged cross sectional view with the probe pin 60 built in the through hole 14 of the main adaptor 12. The upper adaptor 12b is fixed on the upper surface of the lower adaptor 12a by hooks (now shown), and the probe pin 60 is held in the through hole 14. The contact 50 is held by a clip portion 68 of the probe pin 60 through an upper opening 14b. The lower end of the probe pin 60 is protruded from a lower opening 14B to contact with an electrode pad of the circuit board.

SUMMARY

The conventional adaptor for socket as shown in FIGS. 1 to 3 has the following problems. Since the probe pin of the adaptor for socket contacts with the electrode pad of the circuit board from directly above, a constant pressure force is applied between the probe pin and the electrode pad. If there are foreign materials attached on the electrode pad, or the surface of the electrode pad is oxidized, poor electrical connection between the probe pin and the electrode pad or high electrical resistance are caused. As the result, the reliable good electrical connection between the semiconductor device and the circuit board cannot be achieved, and furthermore, such semiconductor device may be judged as defective in burn-in test process, even if it is not defective. Furthermore, the conventional adaptor for socket may be relatively expensive because probe pins require complex working processes for combining the coil spring and the probe pin.

The present disclosure solves the above problems and intends to provide an inexpensive interface structure that enables highly reliable electrical connection.

One embodiment of the subject technology is directed to an interface structure of an electronic component comprising: a main portion made of electrically insulating material, the main portion including a first main surface, a second main surface opposite to the first main surface, and a plurality of through holes passing from the first main surface to the second main surface, an inner wall of each through hole applied with a conductive plating; and a plurality of coil springs made of electrically conductive material, each coil spring being received in the corresponding through hole of the main portion; wherein the coil spring includes a connection portion for connecting a terminal of the electronic component inserted from the through hole at the side of the first main surface, a movable contact portion for contacting with a conductive region at the side of the second main surface, and an elastic portion connected between the connection portion and the movable contact portion.

Preferably, the movable contact portion includes an end portion that is inclined in a direction orthogonal to the axial direction of the coil spring. Preferably, the movable contact portion moves on the conductive region in a horizontal direction due to the inclination of the end portion when the movable contact portion contacts with the conductive region. Preferably, at lease a part of the elastic portion contacts with the plating when the movable contact portion contacts with the conductive region. Preferably, the elastic portion is buckled due to the horizontal movement of the movable contact portion when the movable contact portion contacts with the conductive region. Preferably, the through hole includes a first through hole portion opening at the side of the first main surface and a second through hole opening at the side of the second main surface, wherein the diameter of the first through hole portion is larger than that of the second through hole portion and the external diameter of the connection portion of the coil spring is larger than that of the elastic portion, and wherein the connection portion is supported by a step portion between the first and second through hole portions. Preferably, the connection portion has the internal diameter larger than the terminal of the electronic component and the elastic portion has the internal diameter smaller than the terminal of the electronic component. Preferably, the interface structure further comprises a guide member over the first main surface of the main portion, the guide member including a plurality of through holes at the positions corresponding to each through hole of the main portion, the through hole of the guide member guiding the terminal of the electronic component to the main portion. Preferably, the diameter of the through hole of the guide member is smaller than that of the first through hole portion of the main portion. Preferably, the electronic component is a socket that loads a semiconductor device detachably and the conductive region is an electrode formed on the circuit board.

An interface structure comprises: a socket for loading a semiconductor device; a circuit board; and an adaptor for socket for providing an interface connection between the socket and the circuit board; wherein the adaptor for socket comprises: a main portion made of electrically insulating material, the main portion including a first main surface, a second main surface opposite to the first main surface, and a plurality of through holes passing from the first main surface to the second main surface, an inner wall of each through hole applied with a conductive plating; and a plurality of coil springs made of electrically conductive material, each coil spring being received in the corresponding through hole of the main portion; wherein the coil spring includes a connection portion for connecting a terminal of the electronic component inserted from the through hole at the side of the first main surface, a movable contact portion for contacting with a conductive region at the side of the second main surface, and an elastic portion connected between the connection portion and the movable contact portion. Preferably, the socket is removable from the adaptor for socket.

According to the present disclosure, the inner wall of the through hole of the main portion is plated and the coil spring for contacts is received in the through hole, so that the interface structure may be inexpensive compared with the structure with conventional probe pins and may shorten the current path through the plating of the inner wall of the through hole, thereby reducing the electrical resistance.

It should be appreciated that the subject technology can be implemented and utilized in numerous ways, including without limitation as a process, an apparatus, a system, a device, a method for applications now known and later developed and a device with the functions of the subject technology. These and other unique features of the system disclosed herein will become more readily apparent from the following description and the accompanying drawings.

BRIEF DESCRIPTION OF THE DRAWINGS

So that those having ordinary skill in the art to which the disclosed system appertains will more readily understand how to make and use the same, reference may be had to the following drawings.

FIG. 4B is an enlarged view of a contact. The left side of FIG. 4A illustrates the latch engaged and the right side of FIG. 4B illustrates the latch disengaged.

DETAILED DESCRIPTION OF PREFERRED EMBODIMENTS

The subject technology overcomes many of the prior art problems of socket adapators. The advantages, and other features of the technology disclosed herein, will become more readily apparent to those having ordinary skill in the art from the following detailed description of certain preferred embodiments taken in conjunction with the drawings which set forth representative embodiments of the present invention and wherein like reference numerals identify similar structural elements. References such as up, down, upper, lower, right and left are generally with respect to the figures and not meant in a limiting sense.

Now embodiments according to the present disclosure will be described in detail with reference to the accompanying drawings. In a preferred embodiment, the interface structure according to the present disclosure is carried out as an adaptor for socket. It should be noted that the drawings emphasize each portion for clarity and are not necessarily drawn to scale with respect to an actual device.

Figure 4A:
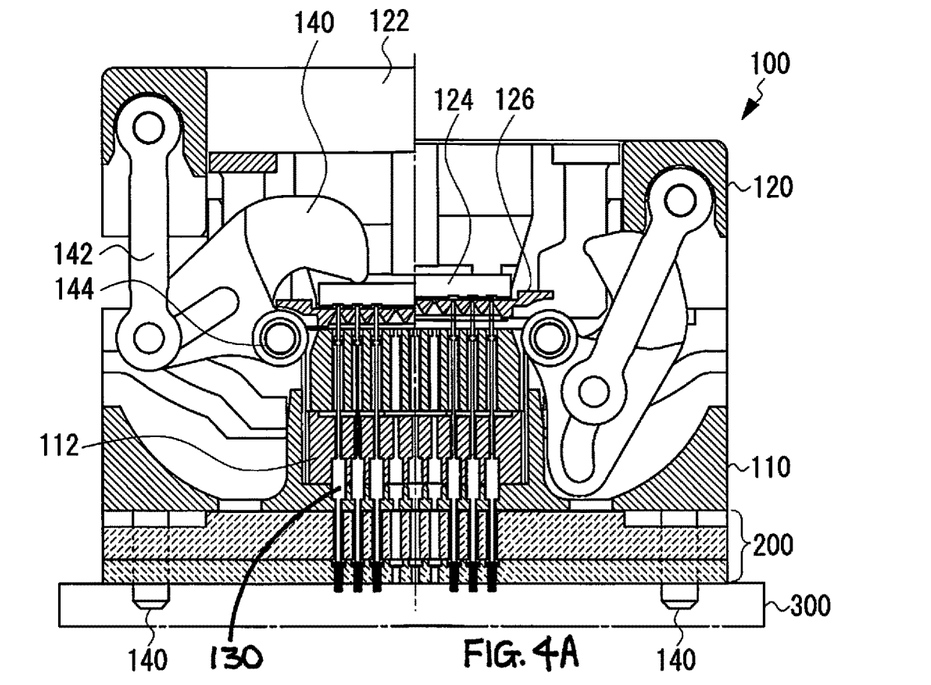
FIG. 4A is a cross sectional view of an adaptor for socket according to an embodiment of the present disclosure.
Figure 4B:
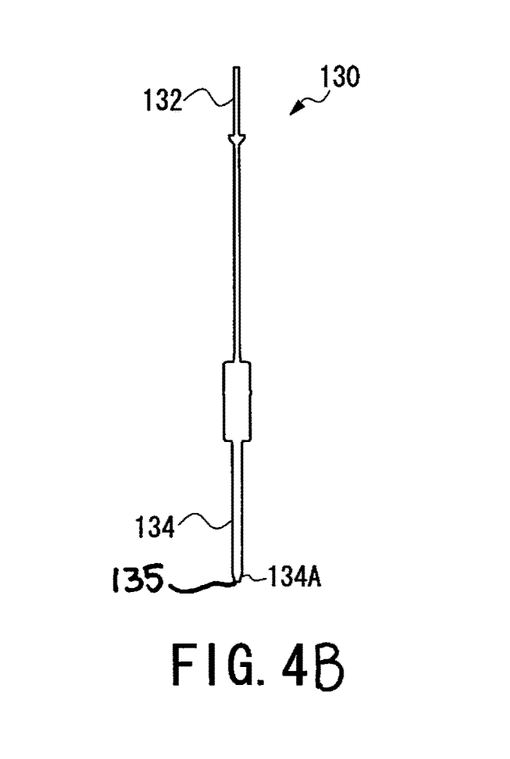

FIG. 4 illustrates an adaptor 200 for socket as an interface structure according to an embodiment of the present disclosure. The adaptor 200 is connected between a socket 100 and a circuit board 300 to provide the electrical and mechanical interface between the socket 100 and the circuit board 300. The socket 100 may be detachably loaded to a surface-mount type semiconductor device such as BGA, LGA, and QFP etc.

The socket 100 shown in FIG. 4 is a typical illustration. The socket 100 includes a base member 110, a cover member 120 that may reciprocate in directions approaching to or separating away from the base member 110, and a plurality of contacts 130 made of electrically conductive material and planted in the base member 110. A contact 130 is shown in isolation in FIG. 4B.

The left side of FIG. 4A illustrates the latch engaged and the right side of FIG. 4B illustrates the latch disengaged. The cover member 120 is constantly urged by a spring member (not shown) in a direction separating away from the base member 110. When the cover member 120 is pressed down as shown on the right side, each latch member 140 is correspondingly evacuated or disengaged. The cover member 120 and each latch member 140 are connected by a link member 142 respectively, and the latch member 140 is rotated on a rotation axis 144 in response to the movement of the link member 142. The rotation axis 144 is typically embodied by a pin or other mounting structure. The semiconductor device 124 is put on a mounting member 126 through a central opening 122 of the cover member 120, and then the cover member 120 is lifted up and the latch member 140 pushes down the top surface of the semiconductor device 124. The press of the latch member 140 causes the mounting member 126 to be lowered to a certain extent, so that a proximal contacting portion 132 of the contact 130 within the through hole of the mounting member 126 protrudes from the top surface of the mounting member 126, thereby allowing the contacting portion 132 to contact with the terminal at the bottom of the semiconductor device 124.

A contact hold member 112 for holding a plurality of contacts 130 is attached to the central portion of the base member 110. The plurality of contacts 130 are arranged in a two dimensional matrix formed by the contact hold member 112. A distal contact lead 134 projects from the bottom surface of the base member 110. Also, a plurality of cylindrical posts 140 for positioning and/or fixing are formed at each corner portion of the bottom surface of the base member 110. FIG. 4(B) shows an enlarged view of the contact 130. Preferably, the contact 130 is processed to a thin plate by, for example, stamping an electrically conductive metal material. Preferably, the contact lead 134 includes a taper portion 134A with the width being gradually narrowed toward the distal end 135.

Figure 5A:
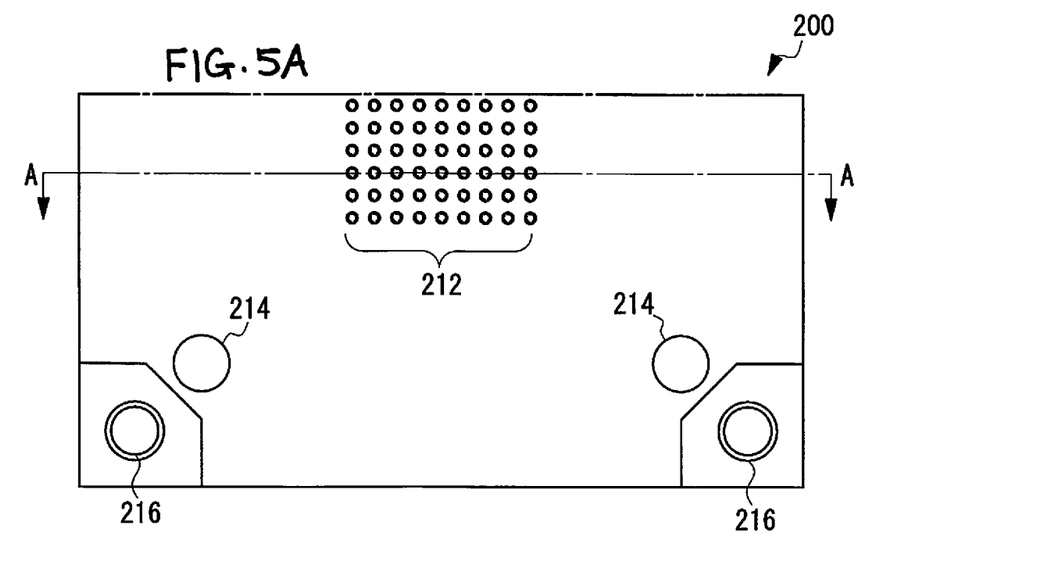
FIG. 5A is a plane view of an adaptor for socket according to an embodiment of the present disclosure.
Figure 5B:
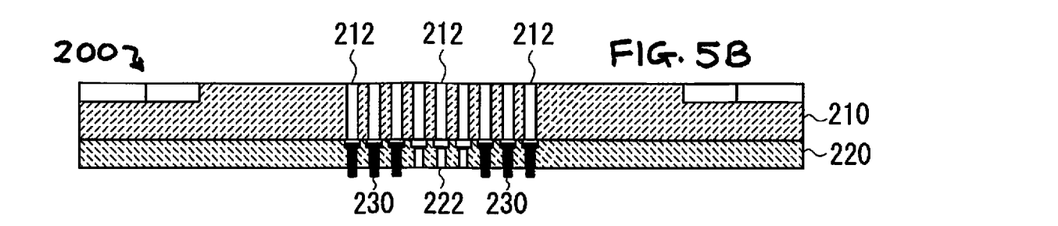
FIG. 5B is a cross sectional view taken along line A-A in FIG. 5A.
Figure 5C:
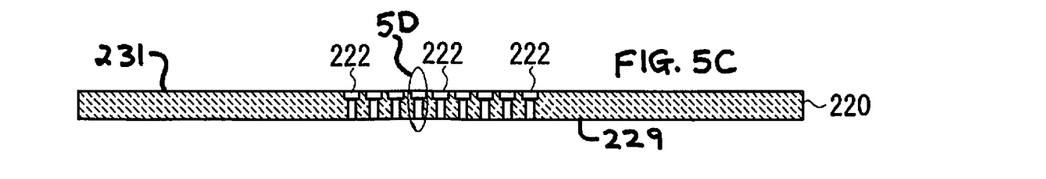
FIG. 5C is a cross sectional view of a base.
Figure 5D:
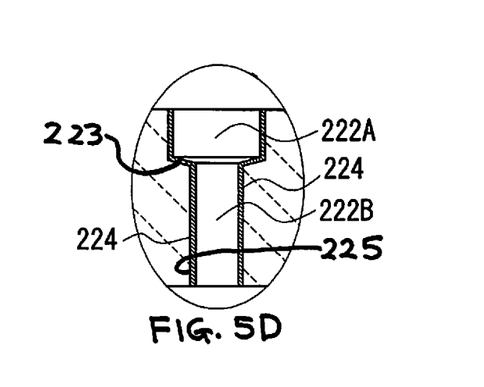
FIG. 5D is an enlarged cross sectional view of a through hole of the base.
Figure 5E:
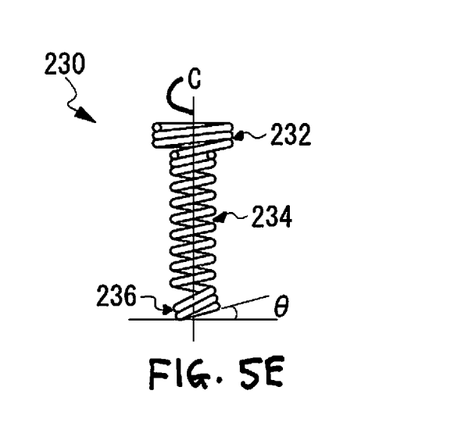
FIG. 5E is an enlarged view of a coil spring.

FIG. 5A is a plane view of an adaptor 200 for socket, FIG. 5B is a cross sectional view of A-A line in FIG. 5A, FIG. 5C is a cross sectional view of a base, FIG. 5D is an enlarged cross sectional view of circle 5D illustrating in detail a through hole of the base, and FIG. 5E is an enlarged view of a coil spring.

Referring in particular to FIGS. 5A-E, the adaptor 200 is configured to include a plate 210 formed with a plurality of through holes 212, a base 220 connected to the lower surface of the plate 210 and formed with a plurality of through holes 222 communicated and aligned with each through hole 212, and a plurality of coil springs 230 received in each through hole 222 of the base 220.

While the adaptor 200 is configured with two layers of the plate 210 and the base 220, the plate 210 may not necessarily be provided. Preferably, the plate 210 guides the contact leads 134 protruded from the socket 100 into the through holes 222 of the base 220. The plate 210 and the base 220 are made of a material for printed circuit boards such as a heat resistant epoxy resin. Alternatively, polyethersulfone (PES), polyetherimide (PEI), polyphenylene sulfide resin (PPS) or liquid crystal polymer (LCP) and the like may be employed.

The plate 210 is generally rectangular-shaped including a flat upper surface and a flat lower surface and formed with a plurality of through holes 212 at the central portion that penetrate from the upper surface to the lower surface. The pitch of the through hole 212 corresponds to that of the contacts 130, and the number of the through holes 212 is typically at least not lower than that of the contacts 130. The diameter of the through holes 212 is sufficient for the contact lead 134 to be passed through. Opening portions 216 are formed at each corner of the plate 210 and the base 220 for inserting the post portion 140 of the socket 100. Preferably, the post portions 140 are detachably engaged with the opening portions 216, namely the socket 100 may be easily removed from the adaptor 200.

The base 220 is generally rectangular-shaped including a flat upper surface and a flat lower surface and has nearly the same size as the plate 210. The plurality of through holes 222 penetrating from the upper surface to the lower surface are formed in the central portion of the base 220 so as to align with the positions of each through hole 212 of the plate 210. The through hole 222 is configured to include two sizes of an upper through hole 222A and a lower through hole 222B, as shown in FIG. 5D. The upper through hole 222A has the diameter relatively larger than that of the through hole 212 of the plate 210, and the lower through hole 222B has the diameter relatively smaller than that of the upper through hole 222A. A first step portion 221 (see FIG. 6A) is provided between the through hole 212 of the plate 210 and the upper through hole 222A, and a second step portion 223 is provided between the upper through hole 222A and the lower through hole 222B. Further in an preferable embodiment, a plating 224 by a metallic material is applied to an inner wall 225 of the through hole 222. The plating 224 is, for example, gold (Au) plating with a nickel (Ni) base coat. To improve a wear resistance, the plating 224 may substitute, for example, the Ni base coat with a nickel tungsten (NiW), or a NiW plating may be formed between the Ni plating and the Au plating. It is appreciated that, for clarity of understanding, the plating 224 is shown in a somewhat schematic or exaggerated manner.

As shown in FIG. 5E, the coil spring 230 includes a proximal or closely winding portion 232 for receiving the contact lead 130, an intermediate elastic portion 234 for providing the elasticity of the axial direction C, and a distal movable contact portion 236 connected to an electrode pad of the circuit board. The external diameter of the closely winding portion 232 is larger than that of the intermediate portion 234 and the closely winding portion 232 is configured by closely winding the coils at multiple times (for example a couple of times). The internal diameter of the closely winding portion 232 is sufficient for the contact lead 134 to be passed through.

The external diameter of the elastic portion 234 is smaller than that of the closely winding portion 232 and the internal diameter of the elastic portion 234 is smaller than the width of the contact lead (not the taper portion 134A). Therefore, the taper portion 134A may be entered into the internal diameter of the elastic portion 234, whereas the contact lead 134 sticks the inner wall of the elastic portion 234 and then stops there. Also the axial length of the elastic portion 234 is adjusted such that the movable contact portion 236 may protrude from the bottom surface of the base 220 when the coil spring 230 is inserted into the through hole 222 of the base 220. The movable contact portion 236 is configured by closely winding the coils at multiple times (for example, a couple of times), which have the same external diameter as the elastic portion 234, and the end portion of the movable contact portion 236 is inclined at an angle θ(theta) with respect to the axial direction C. The angle θ is, for example, within the range of 10 degree to 20 degree, more preferably, about 15 degree. The movable contact portion 236 is moved in the axial direction C as well as moved slightly in an orthogonal direction (horizontal direction) to the axial direction C by a component force, when the force in the axial direction C is applied as discussed below.

Figure 6A:
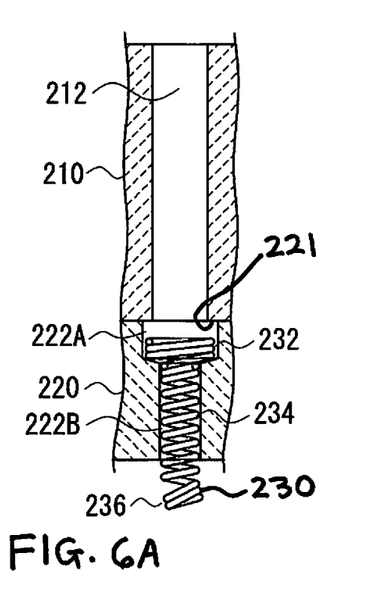
FIG. 6A is a cross sectional view illustrating a condition before the adaptor for socket is attached to a circuit board.

In the assembly of coil spring 230, the plate 210 and the base 220 are initially separated from each other, then the coil spring 230 is inserted into the through hole 222 of the base 210 from the upper side as shown in FIG. 5C. The closely winding portion 232 of the coil spring 230 is supported by the step portion 223 between the upper through hole 222A and the lower through hole 222B, thereby preventing the coil spring 230 from falling off or through. At this time, the movable contact portion 236 slightly projects from the bottom surface 229 of the base 220. After the insertion of the coil spring 230, the bottom surface of the plate 210 is connected to the upper surface 231 of the base 220. Any suitable method may be employed for connecting thereof. For example, the surfaces of both materials may be joined by an adhesive material or fixed by a fastening member such as a bolt by utilizing the through hole 214 which is common for the plate 210 and the base 220. FIG. 6A shows a condition of the coil spring 230 installed. Since the diameter of the through hole 212 of the plate 210 is smaller than that of the closely winding portion 232, the coil spring 230 is captured in the through hole 212 without falling off toward the plate side. Also, it should be noted that the coil springs 230 are installed only at the position corresponding to the contacts of the socket. For example, in the examples shown in FIGS. 4 and 5A-E, since the contact leads 134 are not inserted into the central three through holes 222, the coil springs 230 are not installed therein.

Figure 6B:
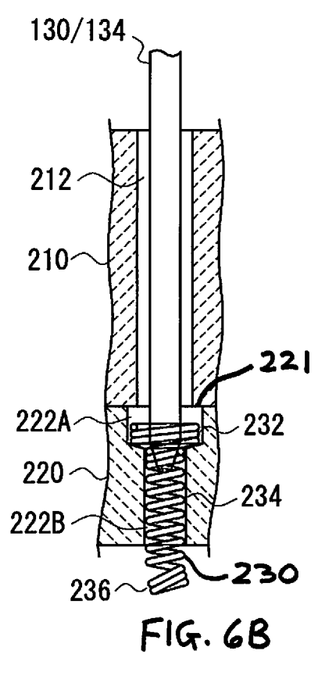
FIG. 6B is a cross sectional view illustrating a condition after the adaptor for socket is attached to the circuit board.
Figure 7:
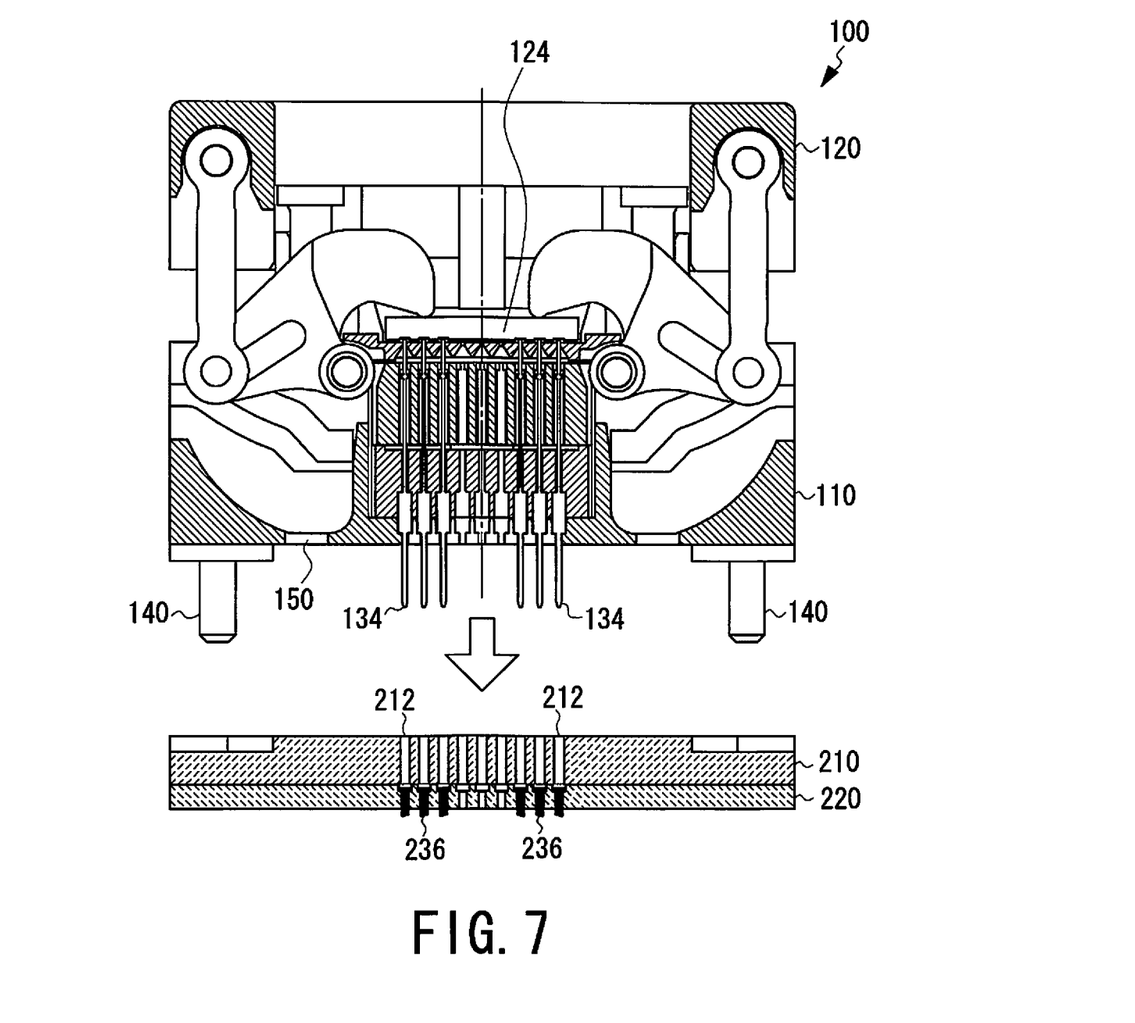
FIG. 7 is a general cross sectional view illustrating a first assemble operation of the adaptor for socket according to an embodiment of the present disclosure.

Now as shown in FIG. 7, a first assembly operation of the adaptor 200 for socket according to the present embodiment will be explained. At first, after the semiconductor device 124 is loaded in the socket 100, the socket 100 is attached to the adaptor 200. The post portions 140 of the socket 100 are inserted into the respective openings 216 and the contact leads 134 are inserted into the corresponding through holes 212, 222. Such condition is shown in FIG. 6B. Namely, the contact lead 134 is guided by the through hole 212 of the plate 210, passes through the closely winding portion 232 of the coil spring 230 within the upper through hole 222A of the base 220, and contacts with the inner wall of the elastic portion 234. As a result, the contact lead 134 is electrically connected with the coil spring 230. The movable contact portion 236 of the coil spring 230 protrudes as shown in FIG. 6B and on the left side of FIG. 8.

Figure 8:
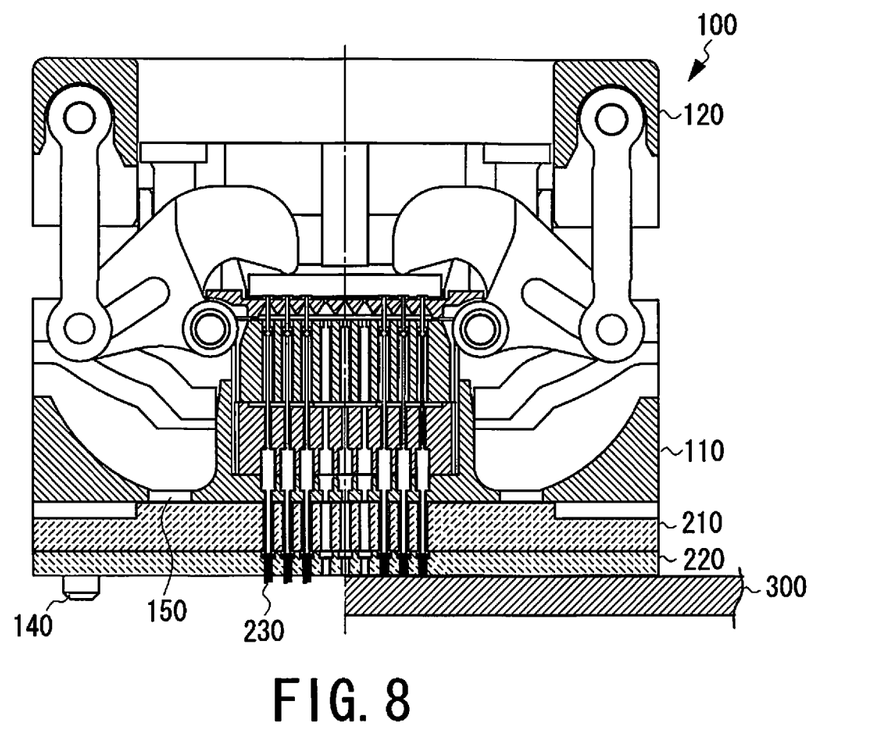
FIG. 8 is a general cross sectional view illustrating the attachment operation of the adaptor for socket to the circuit board according to the present embodiment.
Figure 9:
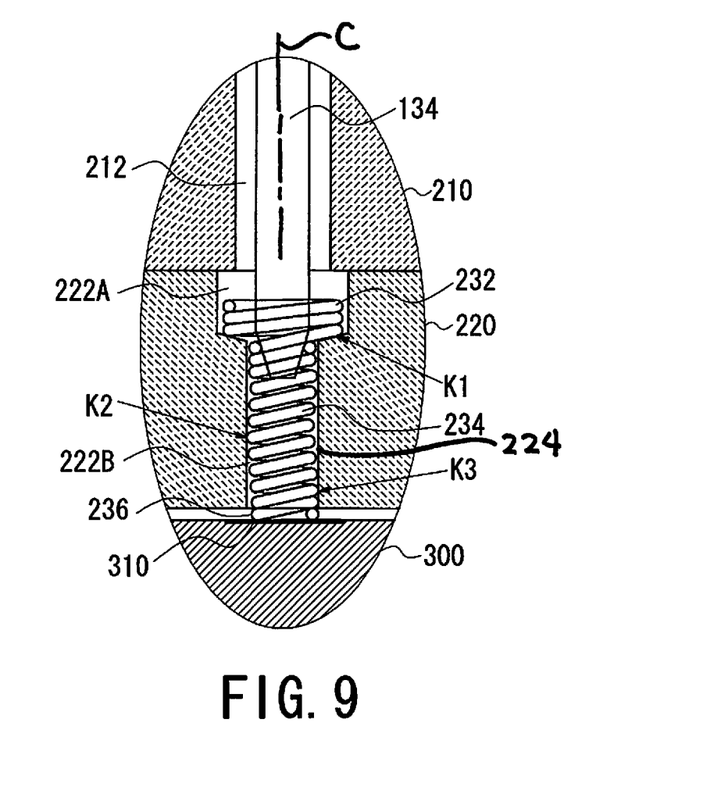
FIG. 9 is a view illustrating an electrical connection of the coil spring of the adaptor for socket according to the present embodiment.

Then, the adaptor 200 is attached to the circuit board 300 as shown in FIG. 8 on the right side. The adaptor 200 and the circuit board 300 may be secured by any suitable way. For example, it may be implemented by inserting a screw member passing through the through hole 214 of the adaptor 200 from the back side of the circuit board 300 and by engaging the edge of the screw member with a securing hole 150 of the base member 110. Such condition is shown in FIG. 9. The movable contact portion 236 of the coil spring 230 is in contact with a conductive land or an electrode of the circuit board 300, therefore the coil spring 230 is applied with a load in the axial direction C. Since the through hole 212 of the plate 210 is smaller than the outer diameter of the closely winding portion 232, the closely winding portion 232 is supported by the bottom surface of the plate 210 and then the elastic portion 234 is compressed in the axial direction C. Thus, the contact lead 134 and the electrode of the circuit board 300 are electrically contacted with each other with a suitable contacting pressure. The elastic portion 234 of the coil spring 230 is also buckled in a direction offset from the axial direction C, so that the coil spring 230 contacts with the plating 224 of the inner wall of the through hole 222 (see FIGS. 5D, 5E and 9). For example, the buckled portions K1, K2 and K3 of the coil spring 230 contact with the plating 224 as shown in FIG. 9. This allows the current path from the contact lead 134 to the circuit board 300 to be shortened, thereby reducing the electrical resistance.

Figure 10A:
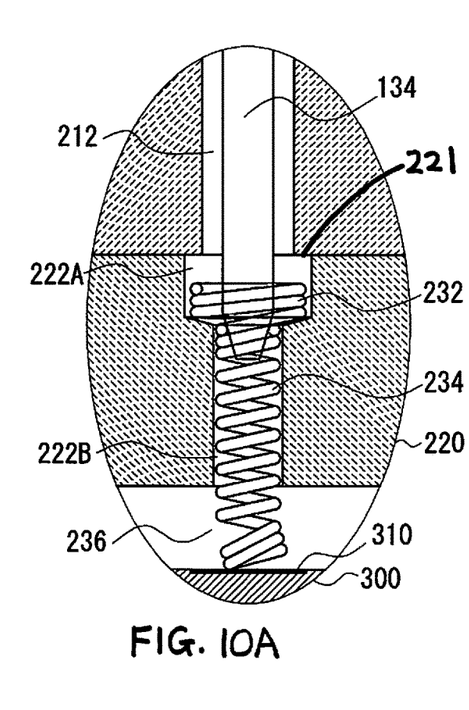
FIGS. 10A and 10B are diagrams illustrating a wiping of a movable contact portion of the adaptor for socket according to the present embodiment.
Figure 10B:
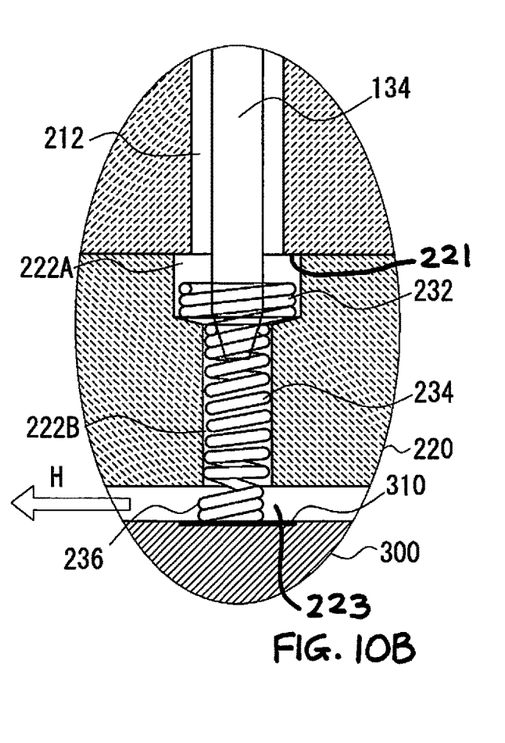

Furthermore, the electrode 310 of the circuit board 300 may be wiped by using the coil spring 230 according to the present embodiment, as shown in FIGS. 10A and 10B. As shown in FIG. 10A, when the movable contact portion 236 is contacted with the electrode 310 and is applied with the force in the axial direction C, since the end of the movable contact portion 236 is inclined at the angle θ, the movable contact portion 236 is applied with a component force in the horizontal direction. Therefore, when the coil spring 230 is compressed, the movable contact portion 236 is moved on the electrode 310 in the horizontal direction H to thereby wipe the electrode 310, as shown in FIG. 10B by arrow H. This allows the oxide layer and/or foreign materials formed on the top surface of the electrode 310 to be removed, thereby decreasing the contact resistance with the electrode 310. It is noted that a gap 233 may be formed between the base 220 and circuit board 300.

Furthermore, the movement of the movable contact portion 236 in the horizontal direction along arrow H makes the elastic portion 234 buckle. For the coil spring without a movable contact portion moving in the horizontal direction, such coil spring may not necessary be buckled, namely, some coil springs are buckled and some coil springs are not buckled, which causes the large variation of the electrical resistance between contacts. In addition, for a burn-in test socket, the thermal expansion or thermal compression of the coil spring due to a large thermal change applied to the coil spring 230 makes the buckling unstable, so that the electrical resistance between the contacts becomes unstable as well. In the present embodiment, the movable contact portion 236 is applied with the force H in the horizontal direction, so that the buckling of the coil spring 230 is facilitated and stabilized, thereby avoiding the variation of the electrical resistance between the contacts.

Further, according to the present embodiment, the electrical path may be shortened by plating the inner walls of the through holes of the base, and the wiping, which was not performed in the conventional spring contact, so that a high reliable interface function may be achieved. Furthermore, the subject socket and burn-in socket may be used for inexpensive surface-mount type socket. Furthermore, since expensive probe pins are not used which are employed in the conventional adaptor for socket, the inexpensive surface-mount type socket may be achieved. Furthermore, since the socket may be removed from the adaptor for socket, the maintenance for the socket is easily performed.

Now, a second assembly operation of the adaptor for socket according to the present embodiment will be explained. In the first assemble operation, the socket 100 is initially installed in the adaptor 200, and then the circuit board 300 is installed. Such assembly order is optional. In the second assembly operation, the adaptor 200 is initially installed on the circuit board 300, and then the socked 100 is installed in the adaptor 200 and the semiconductor device is loaded into the socket 100.

Figure 11A:
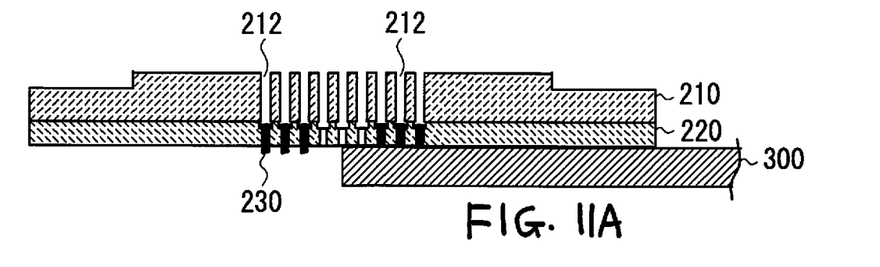
FIG. 11A is a general cross sectional view and FIGS. 11B and 11C illustrate a second assemble operation of the adaptor for socket according to the present embodiment.
Figure 11B:
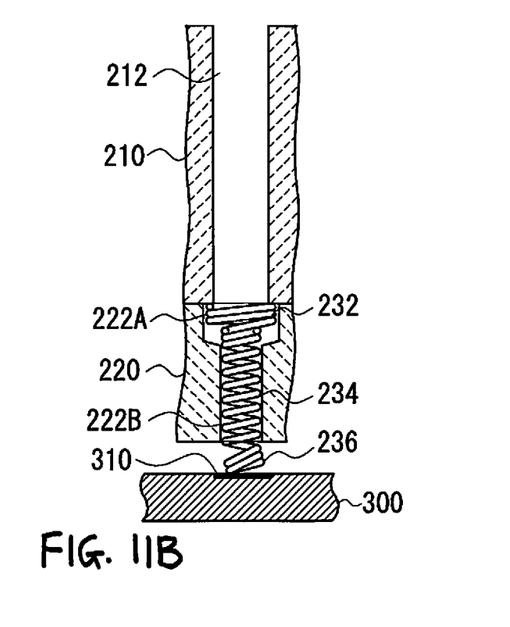
Figure 11C:
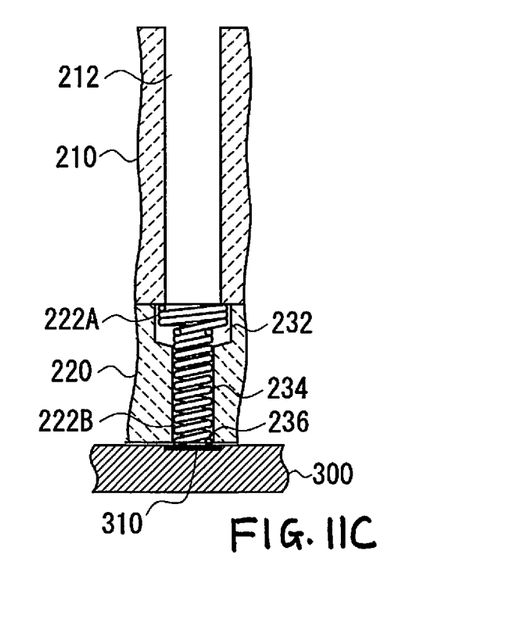

As shown in FIG. 11A on the right side, the adaptor 200 is attached to the circuit board 300. As shown in FIG. 11B, the movable contact portion 236 of the coil spring 230 contacts with the electrode 310 of the circuit board 300, and then the coil spring 230 receives the axial force from the circuit board 300. This allows the coil spring 230 to be lifted until the closely winding portion 232 is contacted with the bottom surface of the plate 210. Furthermore, as shown in FIG. 11C, when the additional axial force is applied to the movable contact portion 236, the elastic portion 234 compresses in the axial direction. The movable contact portion 236 is simultaneously slightly moved in the horizontal direction to thereby wipe the surface of the electrode 310. As illustrated in FIG. 11C, in this instance, there is no gap between the base 220 and circuit board 300 when the axial compression is complete.

Figure 12A:
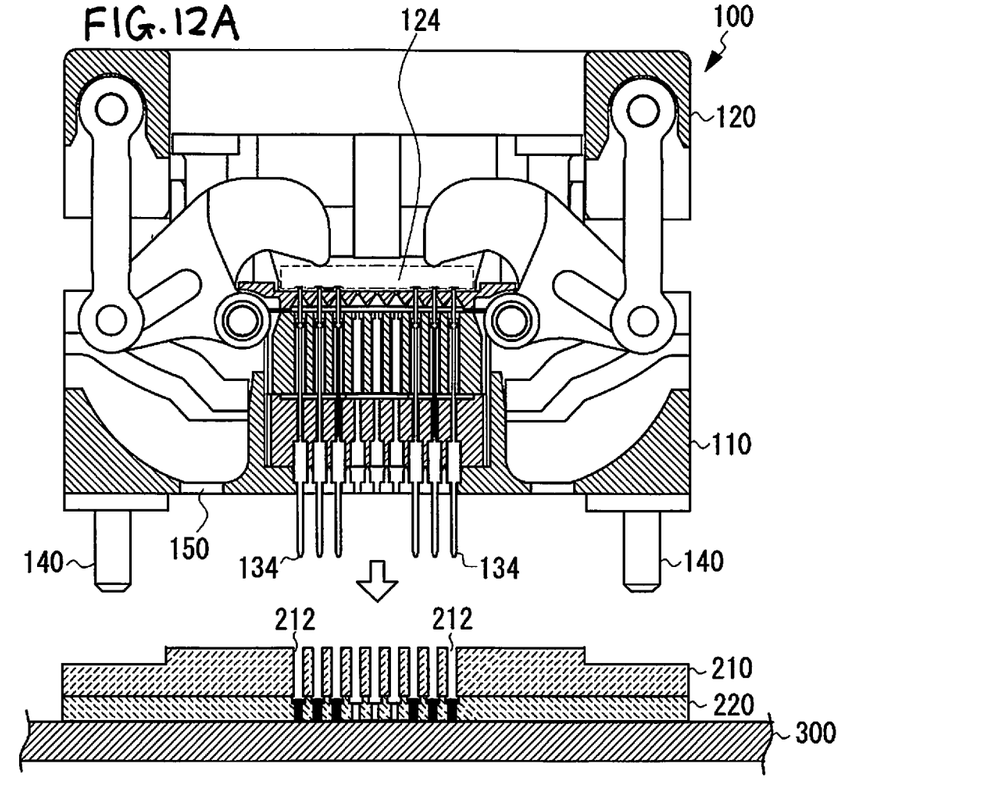
FIG. 12A is a general cross sectional view with a socket being attached on the adaptor for socket during the second assemble operation.
Figure 12B:
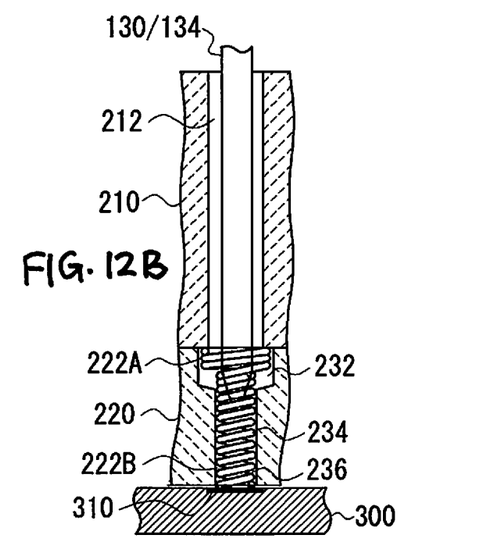
FIGS. 12B and 12C are detailed views of the contact lead during assembly.
Figure 12C:
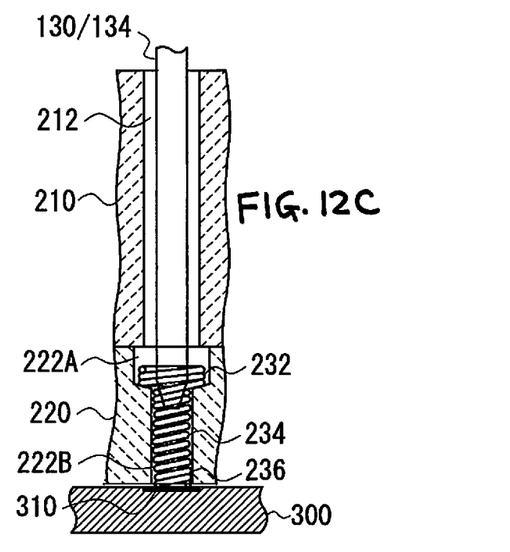

Then, the socket 100 is installed in the adaptor 200 as shown in FIGS. 12A-C. As shown in FIG. 12A, the contact leads 134 projecting from the bottom surface of the socket 100 are guided by the through holes 212 of the plate 210 and inserted into the through holes 222 of the base 220. This condition is shown in FIG. 12B and FIG. 12C. As shown in FIG. 12B, initially, the taper portion 134A of the contact lead 134 passes through the internal diameter portion of the closely winding portion 232 and the taper portion 134A contacts with the internal diameter portion of the elastic portion 234. Then, the contact lead 134 is pushed down further as shown in FIG. 12C, and the elastic portion 234 is correspondingly compressed. At this time, at least a part of the elastic portion 234 is buckled and the movable contact portion 236 is slightly moved in the horizontal direction to thereby wipe the electrode 310.

In the above embodiments, although the adaptor for socket for connecting the socket and circuit board is illustrated as the interface structure, such interface structure according to the present disclosure may make connections between other electronic component and the circuit board or between a plurality of electronic components.

An explanation or legend of Letters or Numerals follows:
100—socket;
110—base member;
120—cover member;
130—contact;
134—contact lead;
200—adaptor for socket;
210—plate;
212—through hole;
220—base;
222—through hole;
222A—upper through hole;
222B—lower through hole;
230—coil spring;
232—closely winding portion;
234—elastic portion;
236—movable contact portion;
300—circuit board; and
310—electrode.

All patents, patent applications and other references disclosed herein are hereby expressly incorporated in their entireties by reference. As explained above, although the exemplary embodiments of the present disclosure have been described in detail, it is not intended to limit the disclosure to these specific exemplary embodiments according to an aspect of the disclosure. It should be understood that various modifications and changes may be made without departing from the inventive scope which is defined by the following claims.

What is claimed is:

1. An interface structure for connecting an electronic component to a circuit board, the interface structure comprising:
a base defining an elongated through hole;
a coil spring retained in the elongated through hole, the coil spring having:
a proximal portion;
a distal portion; and
an intermediate portion extending between the proximal portion and the distal portion,
wherein the distal and intermediate portions have a same external diameter,
wherein, when the coil spring is an uncompressed condition, the distal portion is inclined at an angle θ>0° with respect to a central axis of the intermediate portion of the coil spring, and
wherein the distal portion extends outside the elongated through hole so that as the coil spring is compressed, the coil spring creates a force having a component substantially perpendicular to the central axis.

2. The interface structure of claim 1, wherein the elongated through hole has an upper portion and a lower portion, the upper portion having a relatively larger diameter than the lower portion,
wherein the proximal portion is closely wound with a relatively larger diameter than the intermediate and distal portions, the respective diameters of the proximal and intermediate portions being sized comparably to fit within the upper and lower portions of the elongated through hole, respectively.

3. The interface structure of claim 1, wherein the upper portion and lower portion of the elongated through hole form a transitional step portion for supporting the coil spring when a contact pin is inserted into the coil spring.

4. The interface structure of claim 1, wherein the coil spring buckles when compressed.

5. The interface structure of claim 1, wherein the base is fabricated from an electrically isolative material, the coil spring is conductive, and the elongated through hole has a conductive plating on an inner wall of the elongated through hole.

6. The interface structure of claim 1, further comprising an intermediate plate having a second through hole aligned with the elongated through hole for guiding a contact pin into the coil spring.

7. The interface structure of claim 6, wherein the intermediate plate also retains the coil spring in the elongated through hole.

8. The interface structure of claim 7, wherein the second through hole has a smaller diameter than an upper portion of the elongated through hole for retaining the coil spring.

9. The interface structure of claim 1, wherein the base defines a plurality of elongated through holes, and wherein a coil spring is in each of the plurality of elongated through holes.

10. The interface structure of claim 1, wherein the electronic component comprises a socket.

11. The interface structure of claim 1, wherein the angle θ is in a range of 10° to 20°.

12. The interface structure of claim 11, wherein the angle θ is 15°.

* * * * *